United States Patent
Sugimoto et al.

(10) Patent No.: US 6,281,698 B1
(45) Date of Patent: Aug. 28, 2001

(54) LSI TESTING APPARATUS AND TIMING CALIBRATION METHOD FOR USE THEREWITH

(75) Inventors: Masaru Sugimoto, Tokyo; Yasuhide Nakase; Tomohiro Nishimura, both of Hyogo; Teruhiko Funakura, Tokyo, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/467,153

(22) Filed: Dec. 20, 1999

(30) Foreign Application Priority Data

Jul. 7, 1999 (JP) .................................................. 11-193481

(51) Int. Cl.[7] .................................................. G01R 31/26
(52) U.S. Cl. ........................................... 324/765; 714/724
(58) Field of Search ............................ 324/765; 714/700, 714/724, 726, 728, 736, 738

(56) References Cited

U.S. PATENT DOCUMENTS

| | | | |
|---|---|---|---|
| 4,497,056 | * | 1/1985 | Sugamori .............................. 371/25 |
| 4,928,278 | * | 5/1990 | Otsuji ....................................... 371/1 |
| 5,225,775 | * | 7/1993 | Sekino .............................. 324/158 R |
| 5,703,489 | * | 12/1997 | Kuroe .................................... 324/601 |
| 5,712,582 | * | 1/1998 | Yokota et al. ....................... 327/156 |
| 5,712,882 | * | 1/1998 | Miller ................................... 375/356 |
| 5,894,226 | * | 4/1999 | Koyama .............................. 324/765 |
| 5,905,967 | * | 5/1999 | Botham ............................... 702/118 |
| 6,032,282 | * | 2/2000 | Masuda et al. ...................... 714/744 |

FOREIGN PATENT DOCUMENTS 2-198374  8/1990 (JP) .

* cited by examiner

Primary Examiner—Safet Metjahic
Assistant Examiner—E P LeRoux
(74) Attorney, Agent, or Firm—McDermott, Will & Emery

(57) ABSTRACT

A waveform and timing generation circuit 28, a skew circuit 30, and a pin driver 32 are provided for each of a plurality of I/O terminals 22 corresponding respectively to a plurality of pins furnished on an LSI. A relay 44 and a loop control circuit 46 are provided to feed an output signal of the pin driver 32 back to an input side of the waveform and timing generation circuit 28. A skew board 100 is used to adjust the skew circuit 30, whereby the initial timing calibration is carried out. With the skew circuit 30 thus adjusted, oscillations are generated over the feedback path, and the number of resulting pulses is counted (to obtain pulse cycles). When the skew circuit 30 is adjusted so that the pulse count above matches the number of pulses generated during oscillations, a simplified form of timing calibration is implemented.

13 Claims, 11 Drawing Sheets

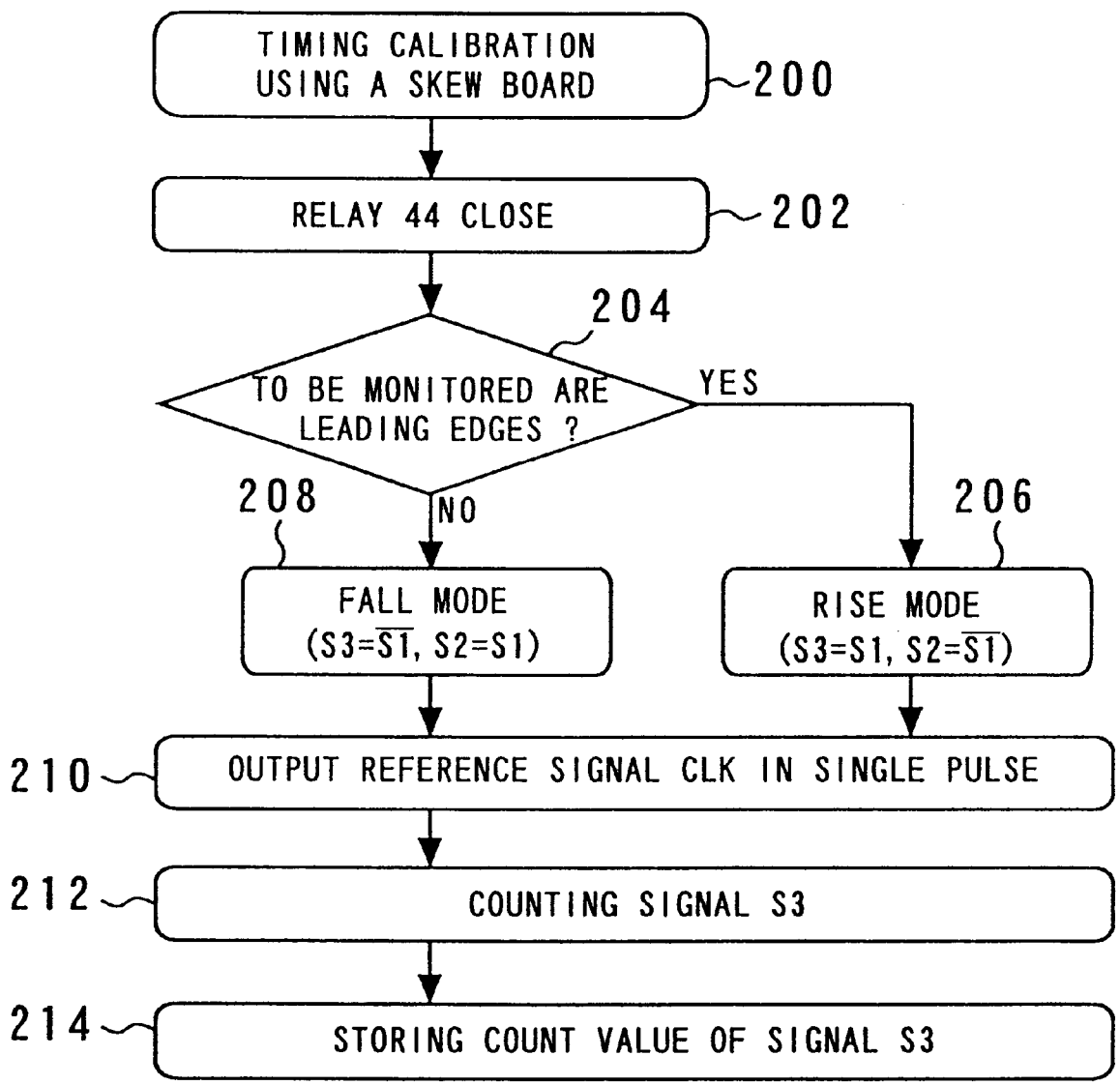

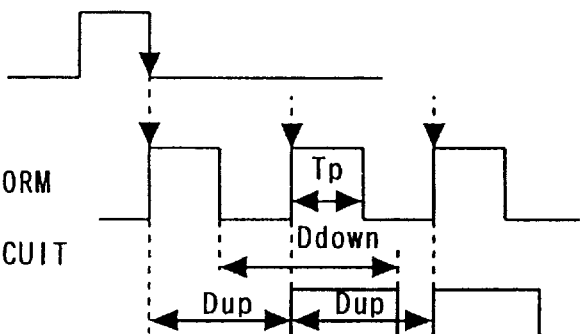
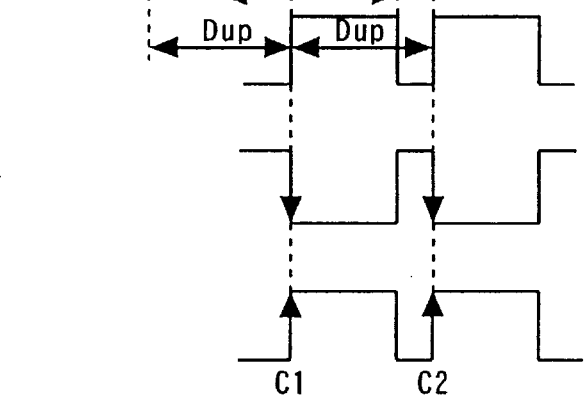
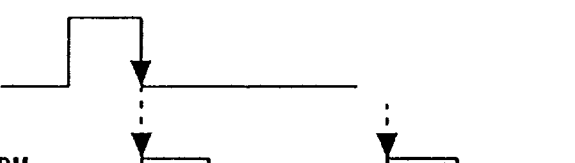
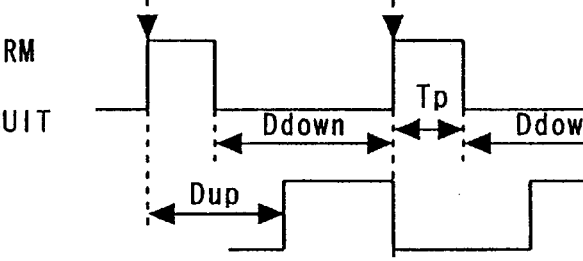

LSI TESTING APPARATUS AND TIMING CALIBRATION METHOD FOR USE THEREWITH

BACKGROUND OF THE INVENTION

1. Field of the Invention

The present invention generally relates to an LSI testing apparatus and a timing calibration method for use therewith. More particularly, the invention relates to an LSI testing apparatus capable of completing its timing calibration in a short period of time and to a timing calibration method for allowing the LSI testing apparatus to finish its timing calibration quickly.

2. Description of the Background Art

FIG. 12 is a block diagram depicting a conventional LSI testing apparatus carrying out timing calibration based on a conventional timing calibration method. The conventional LSI testing apparatus 20 comprises a plurality of input/output (I/O) terminals 22 to be connected to the pins of an LSI (e.g., with pins 1 through N) under test. The testing apparatus 20 supplies the LSI to be tested with a clock signal, address signals and other signals via the I/O terminals 22 for desired tests.

The LSI testing apparatus 20 includes a controller 24 and a reference signal generator 26. The reference signal generator 26 is connected to a waveform and timing generation circuit 28 furnished in corresponding relation to each of the I/O terminals 22. Each waveform and timing generation circuit 28 is made up of two circuits. One circuit generates both a timing signal for varying the value of a signal output from the I/O terminal 22 and a timing signal for determining the value of a signal input to the I/O terminal 22; another circuit determines the waveform of the output signal.

The waveform and timing generation circuit 28 is connected to a pin driver 32 via a skew circuit 30. The skew circuit 30 is used to feed the pin driver 32 after a predetermined delay with a pulse signal generated by the waveform and timing generation circuit 28. The pin driver 32 suitably amplifies the pulse signal, then supplying the amplified signal to the I/O terminal 22.

Each I/O terminal 22 is connected to a decision circuit 38 via a relay 34 and a pin comparator 36. The decision circuit 38 is connected to the waveform and timing generation circuit 28 via another skew circuit 40. The skew circuit 40 is used to supply the decision circuit 38 after a predetermined delay with a timing signal generated by the waveform and timing generation circuit 28. The decision circuit 38 determines the value of the signal input to the I/O terminal 22 synchronizing with the reception timing of the timing signal.

For the LSI testing apparatus to perform tests with high precision requires two preconditions: that signals output by the individual I/O terminals 22 should be consistent and in synchronism, and that signals input to the individual I/O terminals 22 should be consistently determined at an appropriate timing. Thus, the timings involved need to be calibrated from time to time to maintain the accuracy of the LSI testing apparatus.

The conventional LSI testing apparatus has its timing calibration conducted with a skew board 100 connected thereto as shown in FIG. 12. The skew board 100 includes a relay matrix 102 made of hardware. The relay matrix 102 comprises relays corresponding to the plurality of I/O terminals 22 attached to the LSI testing apparatus. The relay matrix 102 is connected to a standard circuit 106 via a switching relay 104 and acts so that one of the I/O terminals 22 is allowed to conduct selectively to the switching relay 104.

The standard circuit 106 has a standard driver 108 and a standard comparator 110. The switching relay 104 allows the relay matrix 102 to connect with either the standard driver 108 or the standard comparator 110. The standard driver 108 and standard comparator 110 operate in synchronism with a reference signal CLK generated by the reference signal generator 26 of the LSI testing apparatus 20.

More specifically, the standard driver 108, when connected to a particular I/O terminal 22 via the switching relay 104 and relay matrix 102, supplies the I/O terminal 22 with a standard signal synchronized with the reference signal CLK. The standard comparator 110, when connected to a specific I/O terminal 22 via the switching relay 104 and relay matrix 102, determines the value of the signal output from the I/O terminal 22 in synchronism with the reference signal CLK.

The timing calibration of the conventional LSI testing apparatus is carried out with the standard circuit 106 of the skew board 100 connected individually to each of the I/O terminals 22. When a single I/O terminal 22 is connected to the standard circuit 106, two processes are performed: one for synchronizing the timings of signals output from a plurality of I/O terminals 22, and another for synchronizing the timings in determining signals input to the individual I/O terminals 22. Described below is an example in which a specific I/O terminal 22 (e.g., terminal 1) is connected to the standard circuit 106, i.e., where the relay matrix 102 connects the I/O terminal 22 in question to the switching relay 104.

The process for synchronizing the output timings is performed while the switching relay 104 is being set to the standard comparator 110. In that case, the signal output from the particular I/O terminal 22 is fed to the standard comparator 110. The standard comparator 110 determines the value of the output signal in synchronized relation with the reference signal CLK. For timing calibration, the result of the determination above is used as a basis for adjusting the delay time of the skew circuit 30 in such a manner that the turning timing of the output signal is synchronized with a standard timing. When the process above has been carried out on all I/O terminals 22, the turning timings of the output signals are synchronized on all terminals 22.

The process for synchronizing the determining timings for the input signals is performed when the relay 34 corresponding to the I/O terminal 22 in question is closed, with the switching relay 104 set to the standard driver 108. In that case, a standard signal generated by the standard driver 108 in synchronism with the reference signal CLK is fed as an input signal to the pin comparator 36. The decision circuit 38 determines the value of the input signal on the basis of the timing signal supplied via the skew circuit 40. For timing calibration, the delay time of the skew circuit 40 is adjusted in such a manner that the value of the standard signal is correctly determined. When the process above has been carried out on all I/O terminals 22, the decision timings of the input signals are synchronized with respect to all terminals 22.

The conventional method of timing calibration allows the LSI testing apparatus 20 to synchronize the turning timings of output signals and the decision timings of input signals on all I/O terminals 22 as described above. One disadvantage of the conventional timing calibration method is that the standard circuit 106 of the skew board 100 needs to be connected individually to all I/O terminals 22, one at a time. In other words, the conventional calibration method requires processing time not less than N(number of pins) times of required time to complete the process for a single pin.

In recent years, as the number of the pins on LSIs to be tested becomes grater, more and more I/O terminals 22 have became required on the LSI testing apparatus 20. That means it takes an inordinately long period of time to carry out the conventional method of timing calibration. In addition, the relay matrix 102 of the skew board 100 must be equipped with as many relays as the number of all I/O pins on the LSI testing apparatus 20. Such a growing number of I/O pins on the testing apparatus 20 can make it increasingly difficult to handle the skew board 20.

Timing calibration of the LSI testing apparatus 20 needs to be performed not only upon shipment or installation of the apparatus but also to provide against any subsequent flaws of the apparatus attributable to aged deterioration or changes in ambient conditions. This requires carrying out timing calibration on a regular basis. Since the timing calibration is performed so frequently, such a large processing time and the enlargement of the skew board 20 may cause a problem in efficiency of operation.

SUMMARY OF THE INVENTION

It is therefore a first object of the present invention to overcome the above and other deficiencies of the prior art and to provide an LSI testing apparatus capable of performing timing calibration in a simplified manner over a short period of time without resorting to a skew board.

It is a second object of the present invention to provide a timing calibration method for effecting timing calibration in a simplified fashion over a reduced period of time without the use of a skew board.

The above objects of the present invention are achieved by an LSI testing apparatus for carrying out performance tests on an LSI having a plurality of pins. The LSI testing apparatus includes a plurality of I/O terminals corresponding respectively to the plurality of pins furnished on the LSI . The apparatus also includes a plurality of control circuits corresponding respectively to the plurality of I/O terminals. Each of the plurality of control circuits includes a waveform and timing generation circuit for generating an output signal upon receipt of a reference signal. A skew circuit is also included in the control circuit for adjusting the output signal in timing. The control circuit further includes a feedback path and a status detection unit. The feedback path is provided for allowing the output signal having passed the skew circuit to be fed back to an input side of the waveform and timing generation circuit. The status detection unit is prepared for detecting status of the skew circuit based on the signal sent over the feedback path.

The above objects of the present invention are also achieved by an LSI testing apparatus for carrying out performance tests on an LSI having a plurality of pins. The LSI testing apparatus includes a plurality of I/O terminals corresponding respectively to the plurality of pins furnished on the LSI . The apparatus also includes a plurality of control circuits corresponding respectively to the plurality of I/O terminals. Each of the plurality of control circuits includes a waveform and timing generation circuit for generating an output signal upon receipt of a reference signal. A skew circuit is also included in the control circuit for adjusting the output signal in timing. The control circuit further includes a first signal feedback path and a status detection unit. The first signal feedback path is provided for connecting a specific I/O terminal different from the I/O terminal reached by the output signal having passed the skew circuit, to an input side of the waveform and timing generation circuit. The status detection unit is prepared for storing status of the skew circuit in accordance with a signal sent over the first signal feedback path. The above objects of the present invention are achieved by a timing calibration method for use with an LSI testing apparatus for carrying out performance tests on an LSI having a plurality of pins. In the inventive timing calibration method, a skew circuit furnished corresponding to each of a plurality of I/O terminals attached to the LSI testing apparatus is adjusted, in such a manner that output signals from the I/O terminals are synchronized in timing. A feedback path is formed for feeding the output signal from each of the I/O terminals, after the adjustment of the skew circuit, to an input side of a waveform and timing generation circuit that has generated the output signal in question. Status of the skew circuit is detected based on the signal sent over the feedback path.

Other objects and further features of the present invention will be apparent from the following detailed description when read in conjunction with the accompanying drawings.

BRIEF DESCRIPTION OF THE DRAWINGS

FIG. 2 is a flowchart of steps constituting an initial timing calibration of the LSI testing apparatus shown in FIG. 1;

FIGS. 3A to 3E are timing charts for describing waveforms of signals generated when the loop control circuit shown in FIG. 1 operates in a rise mode:

FIGS. 4A to 4E are timing charts for describing waveforms of signals generated when the loop control circuit shown in FIG. 1 operates in a fall mode;

DESCRIPTION OF THE PREFERRED EMBODIMENTS

Figure 1:
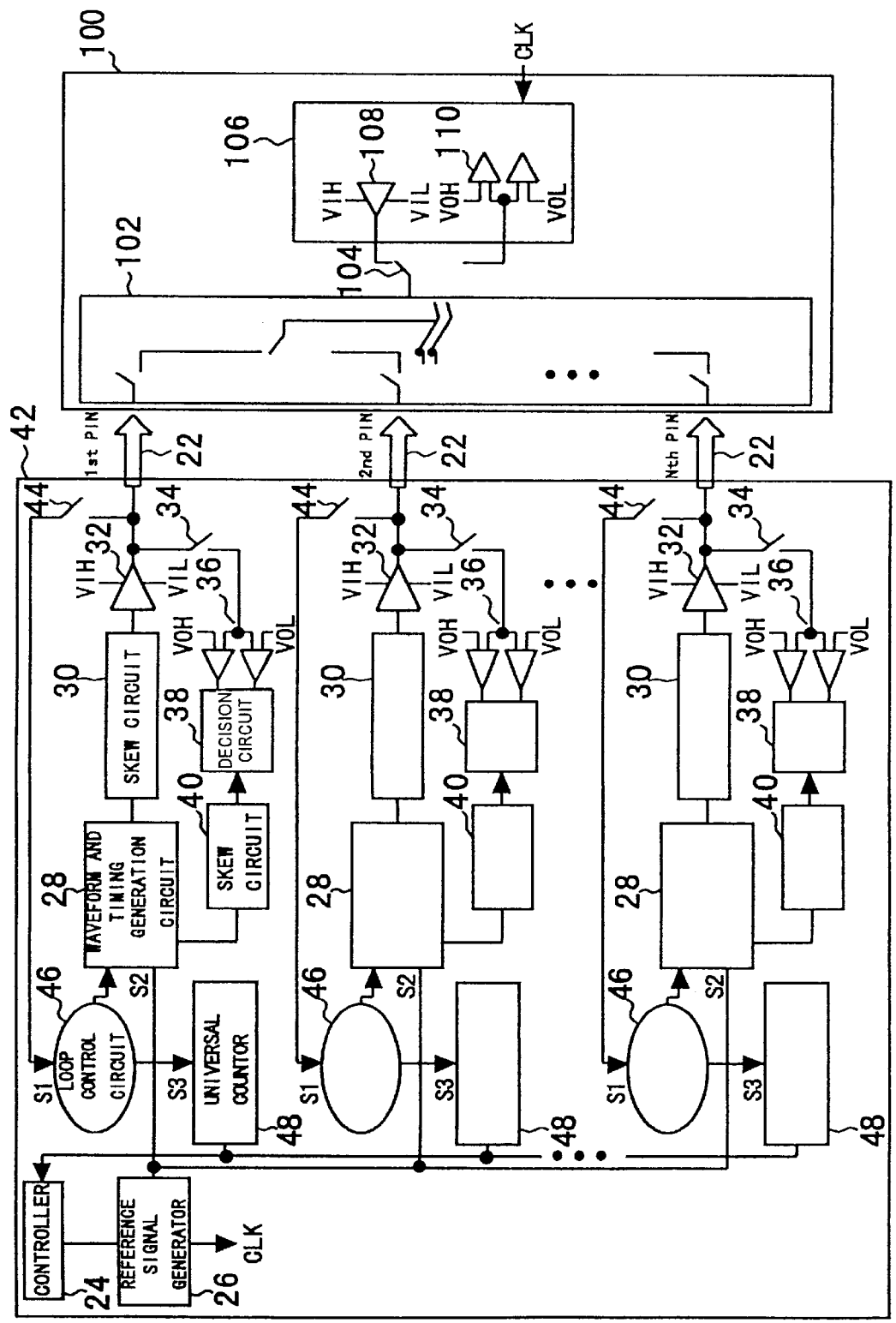
FIG. 1 is a block diagram for describing a timing calibration method performed by an LSI testing apparatus practiced as a first embodiment of the present invention.

Preferred embodiments of this invention will now be described in detail referring to the accompanying drawings, in which like or corresponding parts or steps are designated by common reference numerals. The descriptions of such common parts or steps are omitted hereunder to avoid unnecessary repetition.

First Embodiment

Referring to a block diagram of FIG. 1, there is shown a first embodiment of the invention as applied to an LSI testing apparatus 42 and a timing calibration method for use therewith. The inventive LSI testing apparatus 42 comprises a plurality of I/O terminals 22 to be connected to the pins (1 through N) of an LSI under test. The LSI testing apparatus 42 supplies the LSI under test with a clock signal, address signals and other signals through the I/O terminals 22 for desired tests.

The LSI testing apparatus includes a controller 24 and a reference signal generator 26. The reference signal generator 26 is connected to a waveform and timing generation circuit 28 furnished in corresponding relation to each of the I/O terminals 22. Each waveform and timing generation circuit 28 is made up of two circuits. One circuit generates both a timing signal for varying the value of a signal output from the I/O terminal 22 and a timing signal for determining the value of a signal input to the I/O terminal 22; another circuit determines the waveform of the output signal.

The waveform and timing generation circuit 28 is connected to a pin driver 32 via a skew circuit 30. The skew circuit 30 is used to feed the pin driver 32 after a predetermined delay with a pulse signal generated by the waveform and timing generation circuit 28. More specifically, the skew circuit 30 includes two circuits: one circuit adjusts the delay time of leading edges of the pulse signal output by the waveform and timing generation circuit 28; another circuit adjusts the delay time of trailing edges of the same pulse signal. The pin driver 32 suitably amplifies the pulse signal sent from the skew circuit 30, then supplying the appropriately amplified signal to the I/O terminal 22 in question.

Each I/O terminal 22 is connected to a decision circuit 38 via a relay 34 and a pin comparator 36. The decision circuit 38 is connected to the waveform and timing generation circuit 28 via another skew circuit 40. The skew circuit 40 is used to supply the decision circuit 38 after a predetermined delay with a timing signal generated by the waveform and timing generation circuit 28. The decision circuit 38 determines the value of the signal input to the I/O terminal 22 on the basis of the reception timing of the timing signal.

In the inventive LSI testing apparatus 42, the output terminal of the pin driver 32 is connected to a loop control circuit 46 via a relay 44. Thus, if the relay 44 is closed, a signal S1 output by the pin driver 32 is fed to the loop control circuit 46.

The loop control circuit 46 is connected to the waveform and timing generation circuit 28 and a universal counter 48. Given the output signal S1 from the pin driver 32, the loop control circuit 46 outputs a signal S2 to the waveform and timing generation circuit 28 and a signal S3 to the universal counter 48. As will be described later, the loop control circuit 46 operates in one of two modes: an operation mode called a rise mode in which the signal S2 is made 180° out of phase with the signal S1 and the signal S3 is rendered in phase with the signal S1, and an operation mode called a fall mode in which the signal S2 is made in phase with the signal S1 and the signal S3 is rendered 180° out of phase with the signal S1.

In the first embodiment, the waveform and timing generation circuit 28 transmits a pulse signal having a pulse width Tp to the downstream skew circuit 30 upon receiving a trailing edge of the reference signal CLK from the reference signal generator 26 or a trailing edge of the signal S2 from the loop control circuit 46. The universal counter 48 is capable of counting over a predetermined period of time the number of leading edges of the signal S3 from the loop control circuit 46.

The controller 24 houses a storage medium such as a hard disk. The number of leading edges counted by the universal counter 48 regarding each I/O terminal may be written to the storage medium.

For the LSI testing apparatus 42 to perform tests with high precision requires two preconditions: that signals output by the individual I/O terminals 22 should be consistent and in synchronism, and that signals input to the individual I/O terminals 22 should be consistently determined at an appropriate timing. Thus, the timings involved need to be calibrated from time to time to maintain the accuracy of the LSI testing apparatus.

FIG. 2 is a flowchart of steps constituting an initial timing calibration of the LSI testing apparatus 42. The initial timing calibration of the apparatus is performed illustratively at the time of its shipment from the factory. The initial timing calibration is started by use of a skew board 100 such as the one shown in FIG. 1 (step 200).

The skew board 100 includes a relay matrix 102 made of hardware. The relay matrix 102 comprises relays corresponding to the plurality of I/O terminals 22 attached to the LSI testing apparatus 42. The relay matrix 102 is connected to a standard circuit 106 via a switching relay 104 and acts so that one of the I/O terminals 22 is allowed to conduct selectively to the switching relay 104.

The standard circuit 106 has a standard driver 108 and a standard comparator 110. The switching relay 104 allows the relay matrix 102 to connect with either the standard driver 108 or the standard comparator 110. The standard driver 108 and standard comparator 110 operate in synchronism with the reference signal CLK generated by the reference signal generator 26 of the LSI testing apparatus 42.

More specifically, the standard driver 108, when connected to a particular I/O terminal 22 via the switching relay 104 and relay matrix 102, supplies the I/O terminal 22 with a standard signal synchronized with the reference signal CLK. The standard comparator 110, when connected to a specific I/O terminal 22 via the switching relay 104 and relay matrix 102, determines the value of the signal output from the I/O terminal 22 in synchronism with the reference signal CLK.

The timing calibration using the skew board 100 is carried out with the standard circuit 106 connected individually to each of the I/O terminals 22 one by one. When a single I/O terminal 22 is connected to the standard circuit 106, two processes are performed: one for synchronizing the timings of signals output from a plurality of I/O terminals 22, and another for synchronizing the determining timings for signals input to the individual I/0 terminals 22. Described below is an example in which a specific I/O terminal 22 (e.g., terminal 1) is connected to the standard circuit 106, i.e., where the relay matrix 102 connects the I/O terminal 22 in question to the switching relay 104.

The process for synchronizing the timing of output signals is performed while the switching relay 104 is being set to the standard comparator 110. In that case, the signal output from the particular I/O terminal 22 is fed to the standard comparator 110. The standard comparator 110 determines the value of the output signal in synchronized relation with the reference signal CLK. For timing calibration, the result of the determination above is used as a basis for adjusting the skew circuit 30 in such a manner that the turning timing of the output signal is synchronized with a standard timing, i.e., so that leading and trailing edges of the output signal are generated in synchronism with the standard timing. When the process above has been carried out on all I/0 terminals 22, the turning timings of the output signals are synchronized on all terminals 22.

The process for synchronizing the determining timings for input signals is performed when the relay 34 corresponding to the I/O terminal 22 in question is closed, with the switching relay 104 set to the standard driver 108. In that case, a standard signal generated by the standard driver 108 in synchronism with the reference signal CLK is fed as an input signal to the pin comparator 36. The decision circuit 38 determines the value of the input signal on the basis of the timing signal supplied via the skew circuit 40. For timing calibration, the delay time of the skew circuit 40 is adjusted in such a manner that the value of the standard signal is correctly determined. When the process above has been carried out on all I/O terminals 22, the decision timings of the input signals are synchronized with respect to all terminals 22.

In step 200, the above-described process of timing calibration is performed on all I/O terminals 22 of the LSI testing apparatus 42. Although the process takes time in proportionate relation to the number (N) of I/O terminals 22, the LSI testing apparatus 42 is accurately calibrated in timing. Step 200 is followed by step 202.

In step 202, the relay 44 corresponding to each of the I/O terminals 22 is closed. This forms a loop path for feeding the output signal S1 of the pin driver 32 back to the loop control circuit 46.

In step 204, a check is made to see if the timing to be monitored is that of leading edges of the output signal. If the timing to be monitored is judged to be that of leading edges, step 206 is reached; if the timing to be monitored is found to be that of trailing edges, step 208 is reached.

In step 206, the loop control circuit 46 is arranged to operate in the rise mode in which the signal S3 is rendered in phase with the signal S1 and the signal S2 is made 180° out of phase with the signal S1.

In step 208, the loop control circuit 46 is arranged to operate in the fall mode in which the signal S3 is rendered 180° out of phase with the signal S1 and the signal S2 is made in phase with the signal S1.

In step 210, the reference signal generator 26 outputs the reference signal CLK in a single pulse. Because a loop path has been formed to allow the output signal S1 of the pin driver 32 to be fed back to the loop control circuit 46, the output of the CLK signal triggers oscillations over the path comprising the loop control circuit 46, waveform and timing generation circuit 28, skew circuit 30 and pin driver 32.

In step 212, the universal counter 48 counts the number of leading edges of the signal S3 generated over a predetermined period of time.

In step S214, the leading edge count of the signal S3 taken by the universal counter 48 on each the I/O terminals 22 is written to the storage medium in the controller 24 in correspondence with each I/O terminal 22.

With the first embodiment, steps 210 through 214 for storing the edge count of the signal S3 are carried out on all I/O terminals 22 in both the rise mode and the fall mode in which the loop control circuit 46 operates.

FIGS. 3A through 3E are timing charts depicting a flow of signals in effect when the loop control circuit 46 operates in the rise mode. When a single pulse of the reference signal CLK is output in step 210 (see FIG. 3A), the waveform and timing generation circuit 28 outputs a pulse signal having a pulse width Tp upon receiving the trailing edge of the reference signal pulse (see FIG. 3B).

The skew circuit 30 generates a delay time Dup with regard to the leading edges of the pulse signal from the circuit 28 and a delay time Ddown with regard to the trailing edges of the same signal. As a result, the output signal S1 from the pin driver 32 rises upon elapse of a delay time Dup following each leading edge of the output from the waveform and timing generation circuit 28, and falls upon elapse of a delay time Ddown following each trailing edge of the same output (see FIG. 3C).

When the loop control circuit 46 operates in the rise mode, the signal S2 180° out of phase with the signal S1 is input to the waveform and timing generation circuit 28 (FIG. 3D). In turn, the waveform and timing generation circuit 28 generates the next pulse signal in substantially synchronized relation with a leading edge of the signal S1, i.e., approximately upon elapse of the delay time Dup following a leading edge of the previously generated pulse signal (FIG. 3B).

With the loop control circuit 46 operating in the rise mode, the signal S3 in phase with the signal S1 is input to the universal counter 48 (FIG. 3E). In turn, the universal counter 48 increments its count in substantially synchronized relation with leading edges of the signal S1, i.e., every time the waveform and timing generation circuit 28 generates a new pulse signal (every end of delay time Dup). Thus the count value on the universal counter 48 becomes relational to the delay time Dup.

In the first embodiment, the counting of the signal S3 by the universal counter 48 is performed in a state where the output signal timing of the I/O terminal 22 is precisely calibrated. It follows that with the loop control circuit 46 operating in the rise mode, the count value of the signal S3 stored into the controller 24 becomes relational to the delay time Dup to be generated by the skew circuit 30 to synchronize the leading edge timing of the output signal with the standard timing.

FIGS. 4A through 4E are timing charts depicting a flow of signals in effect when the loop control circuit 46 operates in the fall mode. When a single pulse of the reference signal CLK is output in step 210 (see FIG. 4A), the waveform and timing generation circuit 28 outputs a pulse signal having a pulse width Tp upon receiving the trailing edge of the reference signal pulse (see FIG. 4B).

The skew circuit 30 provides delays in such a manner that the output signal S1 from the pin driver 32 rises upon elapse of a delay time Dup following each leading edge of the output from the waveform and timing generation circuit 28, and falls upon elapse of a delay time Ddown following each trailing edge of the same output (see FIG. 4C).

When the loop control circuit 46 operates in the fall mode, the signal S2 in phase with the signal S1 is input to the waveform and timing generation circuit 28 (FIG. 4D). In turn, the waveform and timing generation circuit 28 generates the next pulse signal in substantially synchronized relation with a trailing edge of the signal S1, i.e., approximately upon elapse of the delay time Ddown following a trailing edge of the previously generated pulse signal (FIG. 4B).

With the loop control circuit 46 operating in the fall mode, the signal S3 180° out of phase with the signal S1 is input to the universal counter 48 (FIG. 4E). In turn, the universal counter 48 increments its count in substantially synchronized relation with trailing edges of the signal S1. In this case, the count value increases every time a predetermined period of time (Ddown+Tp) elapses. Because the pulse width Tp is a predetermined value, the count value on the universal counter 48 becomes relational to the delay times Ddown.

In the first embodiment, the counting of the signal S3 by the universal counter 48 is carried out in a state where the output signal timing of the I/O terminal 22 is precisely calibrated. It follows that with the loop control circuit 46 operating in the fall mode, the count value of the signal S3 stored into the controller 24 becomes relational to the delay time Ddown to be generated by the skew circuit 30 to synchronize the trailing edge timing of the output signal with the standard timing. Hereinafter, the count values of the signal S3 stored into the controller 24 in the manner described for each I/O terminal 22 and for each operation mode of the loop control circuit 46 are called "reference data for simplified processing."

The LSI testing apparatus 42 is capable of being subjected to simplified timing calibration, without recourse to a skew board 100, by utilizing the reference data for simplified processing. The timing calibration is referred to as simplified calibration hereunder.

Figure 5:
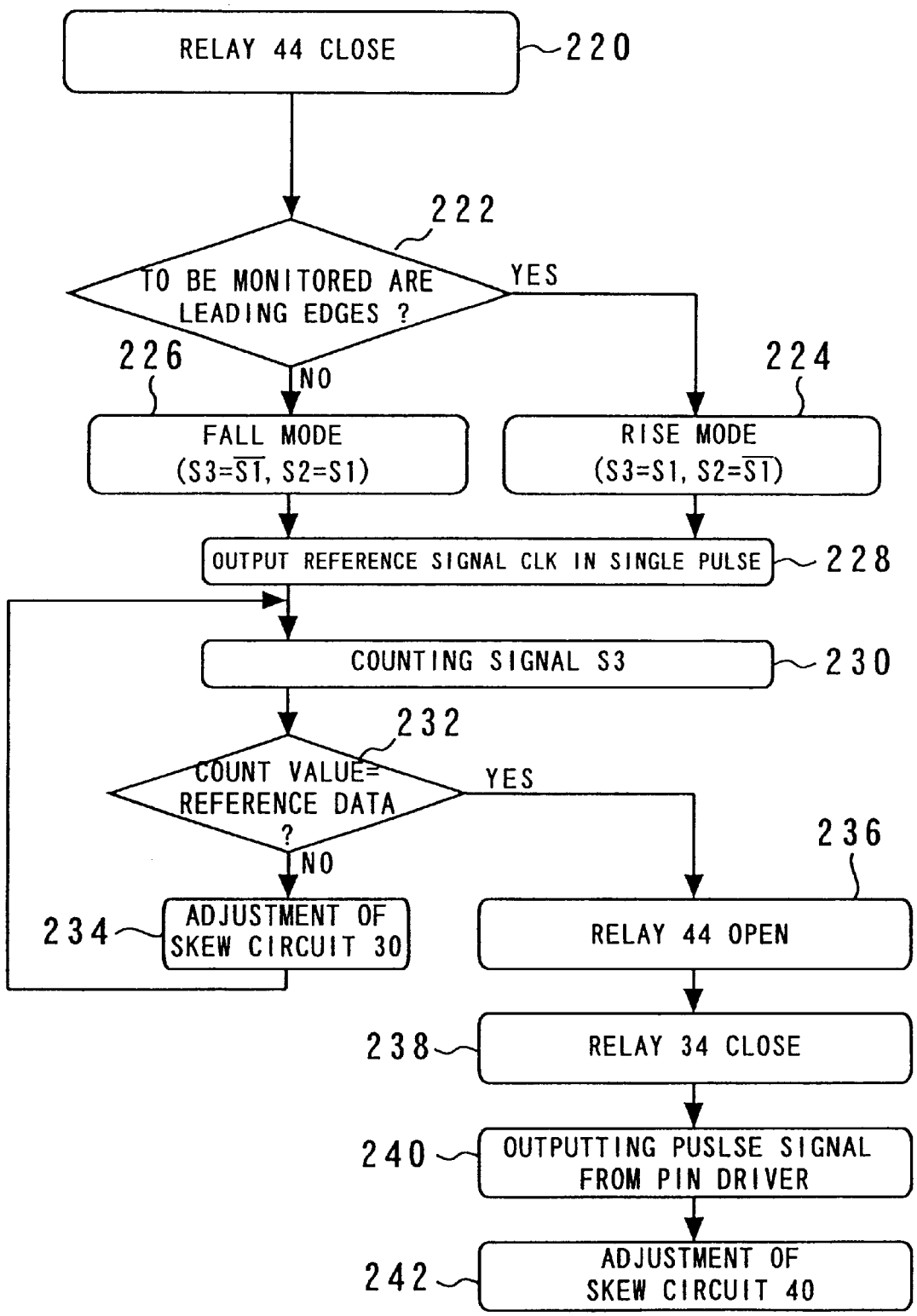
FIG. 5 is a flowchart of steps constituting a simplified timing calibration of the LSI testing apparatus shown in FIG. 1.

FIG. 5 is a flowchart of steps executed to implement the simplified calibration. In step 220, the relay 44 corresponding to the I/O terminal 22 in question is first closed. This forms a loop path for feeding the output signal S1 back to the loop control circuit 46.

In step 222, a check is made to see if the timing to be monitored is that of leading edges of the output signal. If the timing to be monitored is judged to be that of leading edges, step 224 is reached; if the timing to be monitored is found to be that of trailing edges, step 226 is reached.

In step 224, the loop control circuit 46 is arranged to operate in the rise mode in which the signal S3 is rendered in phase with the signal S1 and the signal S2 is made 180° out of phase with the signal S1.

In step 226, the loop control circuit 46 is arranged to operate in the fall mode in which the signal S3 is rendered 180 out of phase with the signal S1 and the signal S2 is made in phase with the signal S1.

In step 228, the reference signal generator 26 outputs the reference signal CLK in a single pulse. Because a loop path has been formed to allow the output signal S1 of the pin driver 32 to be fed back to the loop control circuit 46, the output of the CLK signal triggers oscillations over the path comprising the loop control circuit 46, waveform and timing generation circuit 28, skew circuit 30 and pin driver 32.

In step 230, the universal counter 48 counts the number of leading edges of the signal S3 generated over a predetermined period of time. If the loop control circuit 46 is in the rise mode, the universal counter 48 takes on a value relational to the delay time Dup currently generated by the skew circuit 30; if the loop control circuit 46 is in the fall mode, the count value becomes relational to the delay time Ddown currently generated by the skew circuit 30.

In step 232, a comparison is made between the count value obtained in step 230 and the reference data for simplified processing held in the controller 24. If a mismatch between the count value and the reference data is detected, step 234 is reached; if a match is recognized, step 236 is reached.

If step 234 is reached as a result of the comparison in step 232, the delay time Dup or Ddown of the skew circuit 30 is adjusted in such a manner that the count value on the universal counter 48 matches the reference data for simplified processing. Steps 230 through 234 are repeated until a match is detected in step 232.

In the first embodiment, step 228 through 234 are carried out with the loop control circuit 46 operating in both the rise mode and the fall mode. These steps are performed to bring the states of the skew circuits 30 corresponding to each of the individual I/O terminals 22 to the ones which should be obtained right after the completion of the initial timing calibration. In short, those steps described above make the timings of the output signals be in synchronism with each other on all I/O terminals 22.

Step 228 through 234 of the first embodiment may be carried out concurrently on a plurality of I/O terminals 22. Under the above-described scheme of simplified calibration, the timing calibration of the output signal may be completed in a short period of time regardless of the number of I/O terminals 22 provided on the LSI testing apparatus 42.

In step 236, the relay 44 is opened to break the feedback path of the signal S1.

Instep 238, the relay 34 is closed between the I/O terminal 22 and the pin comparator 36.

In step 240, the pin driver 32 outputs a pulse signal synchronized with the reference signal CLK. Since the timing of the output signal has been calibrated already, the pin driver 32 outputs a pulse signal whose leading and trailing edges comply with the standard timing. The pulse signal from the pin driver 32 is fed to the pin comparator 36 via the relay 34.

In step 242, the skew circuit 40 has its delays adjusted in such a manner that the value of the pulse signal varying in the standard timing and fed to the pin comparator 36 is properly judged by the decision circuit 38.

In the first embodiment, steps 236 through 242 are carried out on the circuits corresponding to all I/O terminals 22. Thus, the steps above when performed synchronize the determining timings of the input signal with respect to all I/O terminals 22.

Steps 236 through 242 of the first embodiment may be carried out concurrently on a plurality of I/O terminals 22. Under the above-described scheme of simplified calibration, the determining timing of the input signal may be calibrated in a short period of time regardless of the number of I/O terminals 22 furnished on the LSI testing apparatus 42.

As described, the LSI testing apparatus 42 embodying the invention may perform the simplified calibration using the reference data for simplified processing. The simplified calibration may be completed in a limited period of time without recourse to a skew board 100. Thus the LSI testing apparatus 42 as the first embodiment is capable of quickly completing the periodically performed timing calibration dealing with aged deterioration and changes in ambient conditions. As such, the inventive LSI testing apparatus 42 achieves a high yield rate when used at semiconductor factories.

Second Embodiment

Figure 6:
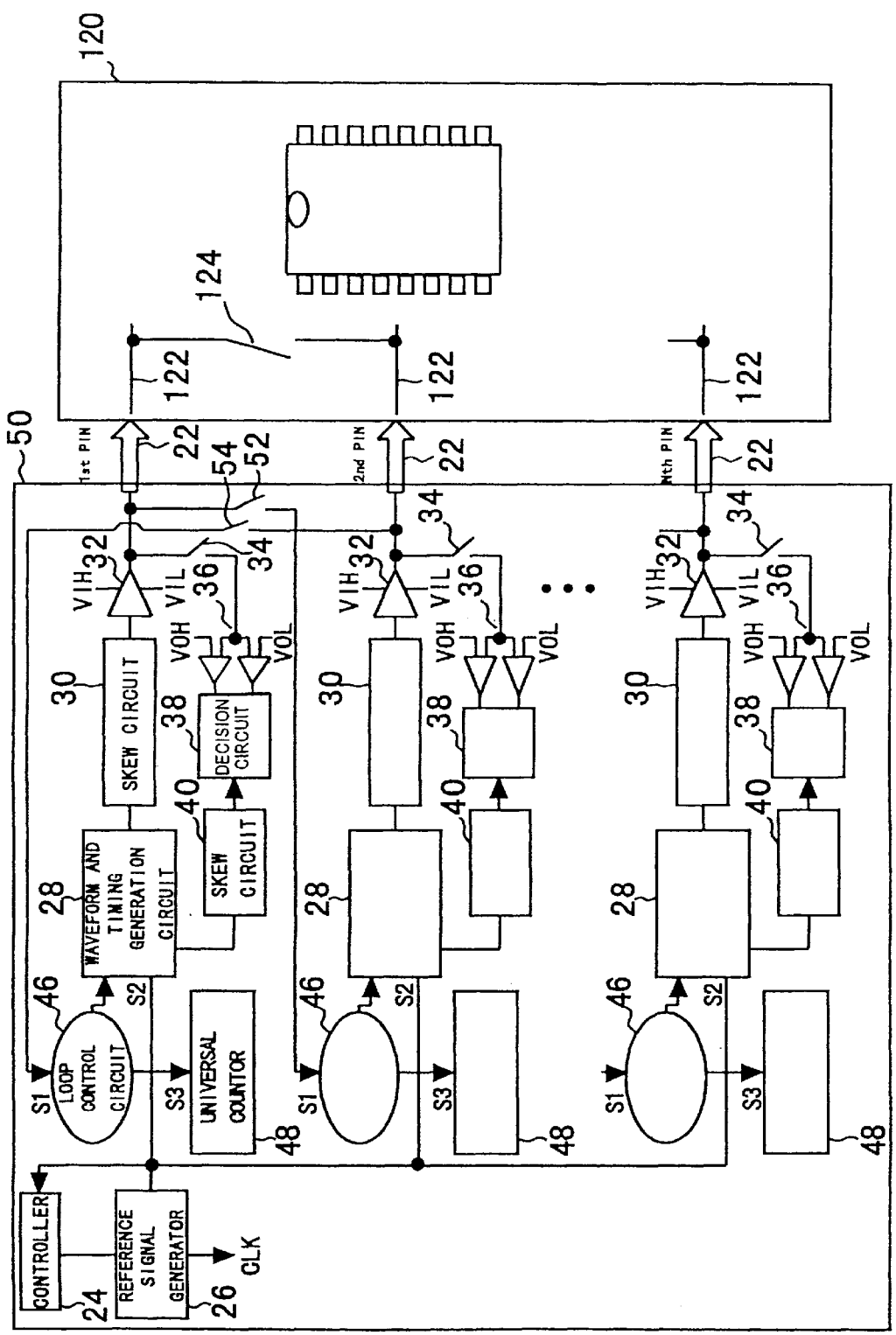
FIG. 6 is a block diagram for describing a timing calibration method performed by an LSI testing apparatus practiced as a second embodiment of the present invention.

A second embodiment of this invention will now be described with reference to FIGS. 6 through 8. FIG. 6 is a block diagram showing a structure of an LSI testing apparatus 50 practiced as the second embodiment as well as a structure of a performance board 120 used as an attachment to the LSI testing apparatus 50. The LSI testing apparatus 50 is connected to the performance board 120 as illustrated in FIG. 6 to test the performance of an LSI mounted on the board 120.

As with the first embodiment, the LSI testing apparatus 50 as the second embodiment comprises a loop control circuit 46 and a universal counter 48 corresponding to each of the individual I/O terminals 22. Of the I/O terminals 22, those corresponding to even-numbered pins of an LSI to be tested are called even-numbered terminals and those corresponding to odd-numbered pins of the LSI are referred as odd-numbered terminals hereunder. The odd-numbered terminals of the LSI testing apparatus 50 are each connected to a relay 52 linked to the loop control circuit 46 corresponding to the adjacent even-numbered terminal. Likewise, the even-numbered terminals of the LSI testing apparatus 50 are each connected to a relay 54 linked to the loop control circuit 46 corresponding to the adjacent odd-numbered terminal.

The performance board 120 includes signal paths 122 corresponding to the individual I/O pins 22 of the LSI testing apparatus 50. The signal paths 122 are linked, through parts not shown, to the pins of the LSI mounted on the performance board 120. The performance board 120 also has relays 124 furnished interposingly between the signal path 122 corresponding to each even-numbered terminal of the LSI testing apparatus on the one hand and the signal path 122 corresponding to the odd-numbered terminal adjacent to the even-numbered terminal in question.

Closing a relay 52 in the inventive LSI testing apparatus 50 and the relay 124 on the performance board 120 forms a loop path that feeds the output signal S1 of the pin driver 32 corresponding to an even-numbered terminal back to the loop control circuit 46 corresponding to the same terminal (the loop path includes part of the signal path 122 on the performance board 120). Similarly, closing a relay 54 and the relay 124 forms a loop path that feeds the output signal S1 of the pin driver 32 corresponding to an odd-numbered terminal back to the loop control circuit 46 corresponding to the same terminal (the loop path likewise includes part of the signal path 122 on the performance board 120).

Figure 7:
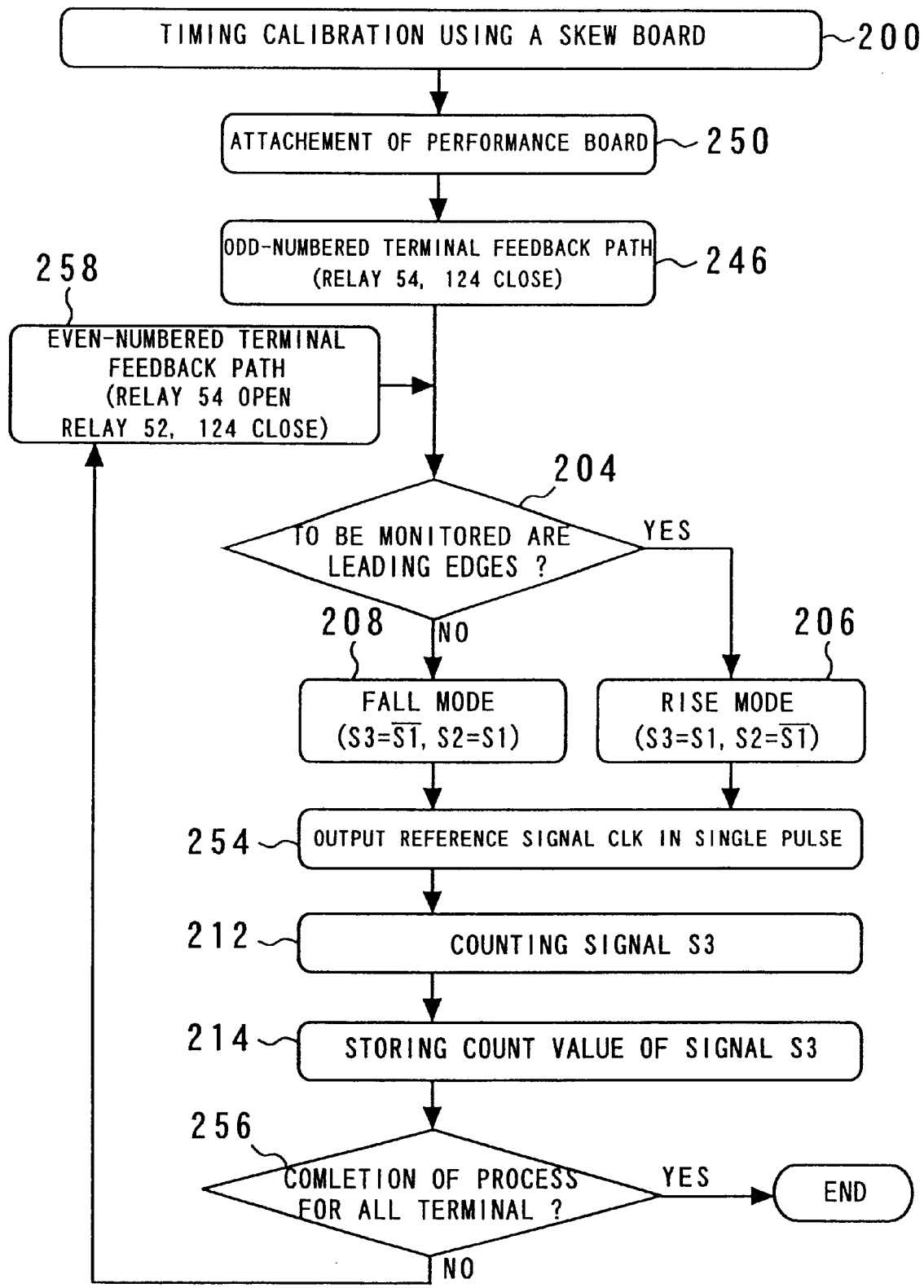
FIG. 7 is a flowchart of steps constituting an initial timing calibration of the LSI testing apparatus shown in FIG. 6.

FIG. 7 is a flowchart of steps constituting the initial timing calibration of the LSI testing apparatus 50 which is performed illustratively at the time of its shipment from the factory. In FIG. 7, the steps with their functionally identical counterparts already shown in FIG. 2 are given the same reference numerals, and their detailed descriptions are abbreviated or omitted hereunder.

In step 200, as in the case of the first embodiment, the initial timing calibration is started by use of the skew board 100. With the relays 52 and 54 both left open, each of all I/O terminals 22 is subjected to timing calibration in the same sequence as in the first embodiment. Immediately after the initial timing calibration has ended, step 250 is reached.

In step 250, the performance board 120 is connected to the LSI testing apparatus 50 as an attachment to the latter.

In step 246, a relay 54 of the LSI testing apparatus 50 and the relay 124 of the performance board 120 are both closed. This forms a feedback path corresponding to an odd-numbered terminal (I/O terminal 22) of the LSI testing apparatus 50.

In steps 204, 206 and 208, the operation mode of the loop control circuit 46 is established in accordance with the timing to be monitored as in the case of the first embodiment.

In step 254, the reference signal generator 26 corresponding to the odd- or even-numbered terminal in question outputs the reference signal CLK in a single pulse. If the reference signal CLK is output by the reference signal generator 26 connected to the odd-numbered terminal, the signal CLK is sent successively to the waveform and timing generation circuit 28 and pin driver 32 corresponding to the odd-numbered terminal in question. The output signal S1 of the pin driver 32 keyed to the odd-numbered terminal is fed back through the feedback path to the loop control circuit 46 corresponding to the odd-numbered terminal in question. This triggers oscillations over the path comprising the loop control circuit 46 and the waveform and timing generation circuit 28 corresponding to the odd-numbered terminal. If the reference signal CLK is output by the reference signal generator 26 connected to the even-numbered terminal, the signal CLK is sent successively to the waveform and timing generation circuit 28 and pin driver 32 corresponding to the even-numbered terminal in question. The output signal S1 of the pin driver 32 keyed to the even-numbered terminal is fed back through the feedback path (relay 54) to the loop control circuit 46 corresponding to the odd-numbered terminal. This, too, triggers oscillations over the path comprising the loop control circuit 46 and the waveform and timing generation circuit 28 corresponding to the odd-numbered terminal.

In steps 212 and 214, as in the case of the first embodiment, the count value of the signal S3 counted by the universal counter 48 is written to the storage medium in the controller 24. Step 254, 212 and 214 are carried out with the loop control circuit 46 operating in both the rise mode and the fall mode. The process above when performed stores the reference data for simplified processing regarding the odd-numbered terminal.

In step 256, a check is made to see if the process for storing the reference data for simplified processing is completed on all odd- and even-numbered terminals. If any terminal has yet to undergo the data storing process, step 258 is reached; if all terminals are judged to have undergone the process, the current processing is now terminated.

In step 258, a relay 54 is opened and a relay 52 is closed in the LSI testing apparatus 50 while a relay 124 is closed on the performance board 120. This forms a feedback path corresponding to an even-numbered terminal (I/O terminal 22) of the LSI testing apparatus 50.

Thereafter, step 204 and subsequent steps are carried out in the same manner as when the feedback path is formed for an odd-numbered terminal. The steps, when performed, store into the controller 24 the reference data for simplified processing regarding the even-numbered terminal in question. The process above makes it possible to store the reference data for simplified processing on all I/O terminals 22, i.e., the count values reflecting the delay times Dup and Ddown generated by the skew circuit 30 in such a manner that leading and trailing edges of the output signal are made to comply with the standard timing on all I/O terminals 22.

At a semiconductor factory, the LSI testing apparatus 50 practiced as the second embodiment is used with the performance board 120 attached thereto. Without recourse to a skew board 100, the LSI testing apparatus 50 connected to the performance board 120 may utilize the above-described reference data for simplified processing in carrying out the simplified calibration.

Figure 8:
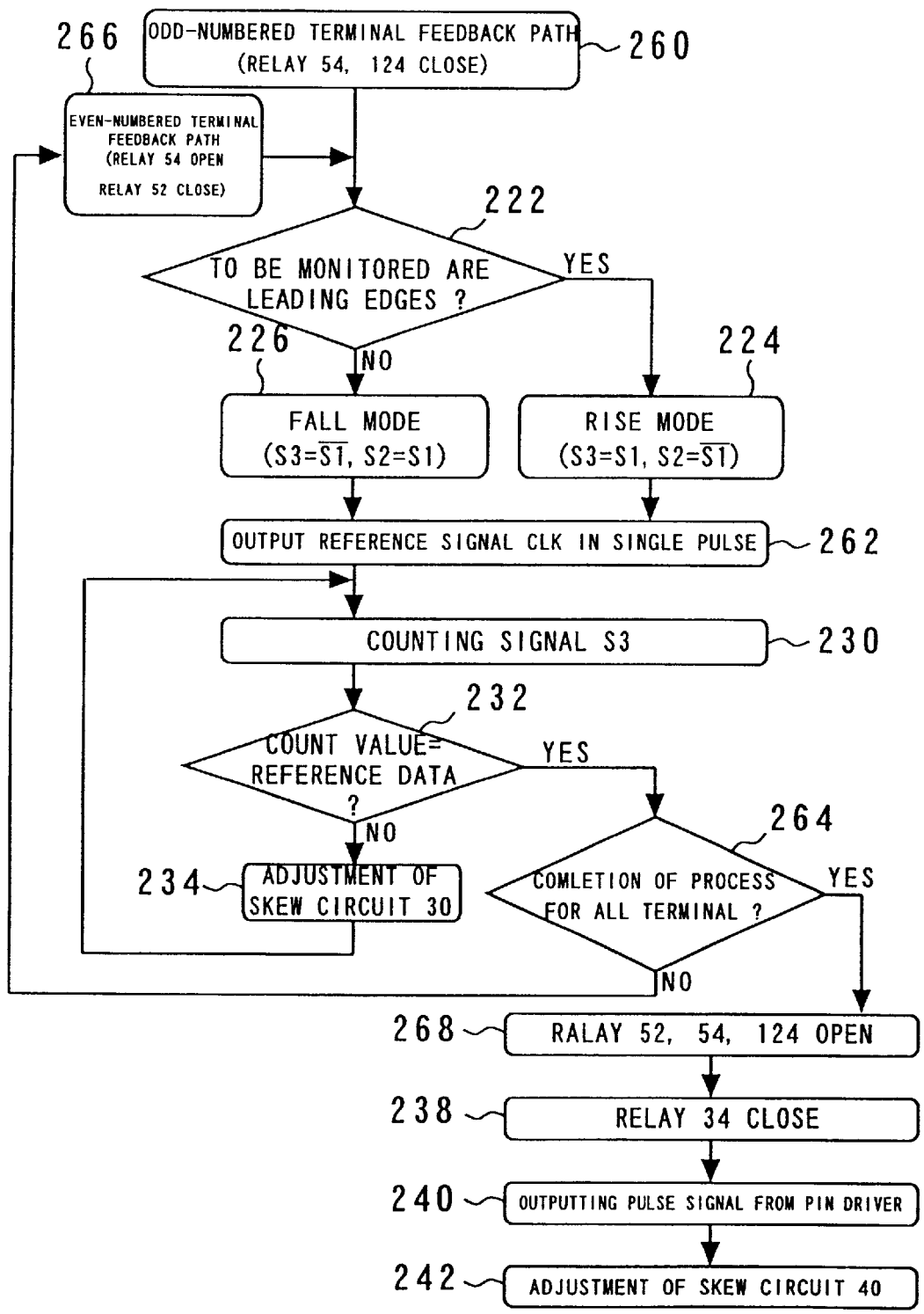
FIG. 8 is a flowchart of steps constituting a simplified timing calibration of the LSI testing apparatus shown in FIG. 6.

FIG. 8 is a flowchart of steps executed to implement the simplified calibration. In FIG. 8, the steps with their functionally identical counterparts already shown in FIG. 5 are given the same reference numerals, and their detailed descriptions are abbreviated or omitted hereunder.

In the simplified calibration, as shown in step 260, relays 54 and 124 are first closed to form a feedback path corresponding to an odd-numbered terminal.

In steps 222, 224 and 226, the operation mode of the loop control circuit 46 is established in accordance with the timing to be monitored as in the case of the first embodiment.

In step 262, the reference signal generator 26 corresponding to the odd- or even-numbered terminal in question outputs the reference signal CLK in a single pulse. This triggers oscillations over the path comprising the loop control circuit 46 and the waveform and timing generation circuit 28 corresponding to the odd-numbered terminal (see step 254 above).

In steps 230 through 234, as in the case of the first embodiment, the delay time Dup or Ddown of the skew circuit 30 corresponding to the I/O terminal 22 in question (odd-numbered terminal this time) is adjusted in such a manner that the count value on the universal counter 48 matches the reference data for simplified processing held in the controller 24.

In the second embodiment, step 262 and 230 through 234 are carried out with the loop control circuit 46 operating in both the rise mode and the fall mode. These steps are performed to bring the states of the skew circuits 30 corresponding to the I/O terminals 22 in question (odd-numbered terminals this time) to the ones which should be obtained right after the completion of the initial timing calibration.

In step 264, a check is made to see if the process constituted by steps 222 through 234 is completed on all odd-and even-numbered terminals. If any terminal has yet to undergo the process, step 266 is reached; if all terminals are judged to have undergone the process, step 268 is reached.

In step 266, a relay 54 is opened and a relay 52 is closed in the LSI testing apparatus 50 while a relay 124 is closed on the performance board 120. This forms a feedback path corresponding to an even-numbered terminal of the LSI testing apparatus 50.

Thereafter, step 222 and subsequent steps are carried out in the same manner as when the feedback path is formed for an odd-numbered terminal. These steps are performed to bring the states of the skew circuits 30 corresponding to the even-numbered terminals to the ones which should be obtained right after the completion of the initial timing calibration. Thus steps 260 through 264, when carried out, synchronize the timings of the output signal with respect to all I/O terminals 22.

Steps 262 and 230 through 234 of the second embodiment may be carried out concurrently on a plurality of I/O terminals 22. Under the above-described scheme of simplified calibration, the timing calibration of the output signal may be completed in a short period of time regardless of the number of I/O terminals 22 furnished on the LSI testing apparatus 50.

In step 268, the relays 52, 54 and 124 are opened. This breaks both the feedback path corresponding to any odd-numbered terminal and the feedback path keyed to any even-numbered terminal.

In steps 238 through 242, as in the case of the first embodiment, the skew circuit 40 is adjusted by use of the output signal from the pin driver 32, i.e., using the output signal which is just properly calibrated. These steps are carried out on the circuits corresponding to all I/O terminals 22. Thus the steps above, when performed, synchronize the determining timings of the input signal with respect to all I/O terminals 22.

Steps 268 and 238 through 242 of the second embodiment may be carried out concurrently on a plurality of I/O terminals 22. Under the above-described scheme of simplified calibration, the determining timing of the input signal may be calibrated in a short period of time regardless of the number of I/O terminals 22 furnished on the LSI testing apparatus 50.

As described, the LSI testing apparatus 50 practiced as the second embodiment may carry out the simplified calibration while being connected with the performance board 120. This allows the inventive LSI testing apparatus 50 to achieve a high yield rate when used in semiconductor factories.

The simplified calibration according to the first embodiment is performed by the LSI testing apparatus 42 alone. This means that the effects of aged deterioration over the signal paths 122 of the performance board 120 cannot be absorbed through the simplified calibration conducted by the first embodiment.

The testing of an LSI by the LSI testing apparatus 50 is done with the LSI testing apparatus 50 linked to the LSI to be tested via signal paths 122 of the performance board 120. In order to ensure the accuracy of LSI testing, it is thus preferred to be able to absorb the effects of aged deterioration over the signal paths 122 through timing calibration.

As mentioned, the simplified calibration by the second embodiment makes use of feedback paths each comprising a signal path 122. Thus carrying out the simplified calibration allows the delay times Dup and Ddown of the skew circuit 30 to be adjusted in such a manner that effects of characteristic changes over the signal paths 122 are absorbed. Because the simplified calibration performed by the second embodiment absorbs the effects of aged deterioration on the performance board 120, the second embodiment offers timing calibration with an appreciably higher degree of precision than the first embodiment.

Although the second embodiment was shown implementing the feedback path keyed to each of the I/O terminals 22 using the signal path 122 corresponding to the adjacent I/O terminal 22, this is not limitative of the invention. Other variations may be made when every I/O terminal 22 solely meets two conditions described below: the first condition is that a feedback path must be provided to let the output signal S1 of the pin driver 32 be fed back to the loop control circuit 46; and the second condition is that the feedback path must be formed using both the signal path 122 for the current I/O terminal 22 and the signal path 122 corresponding to another I/O terminal 22.

Third Embodiment

Figure 9:
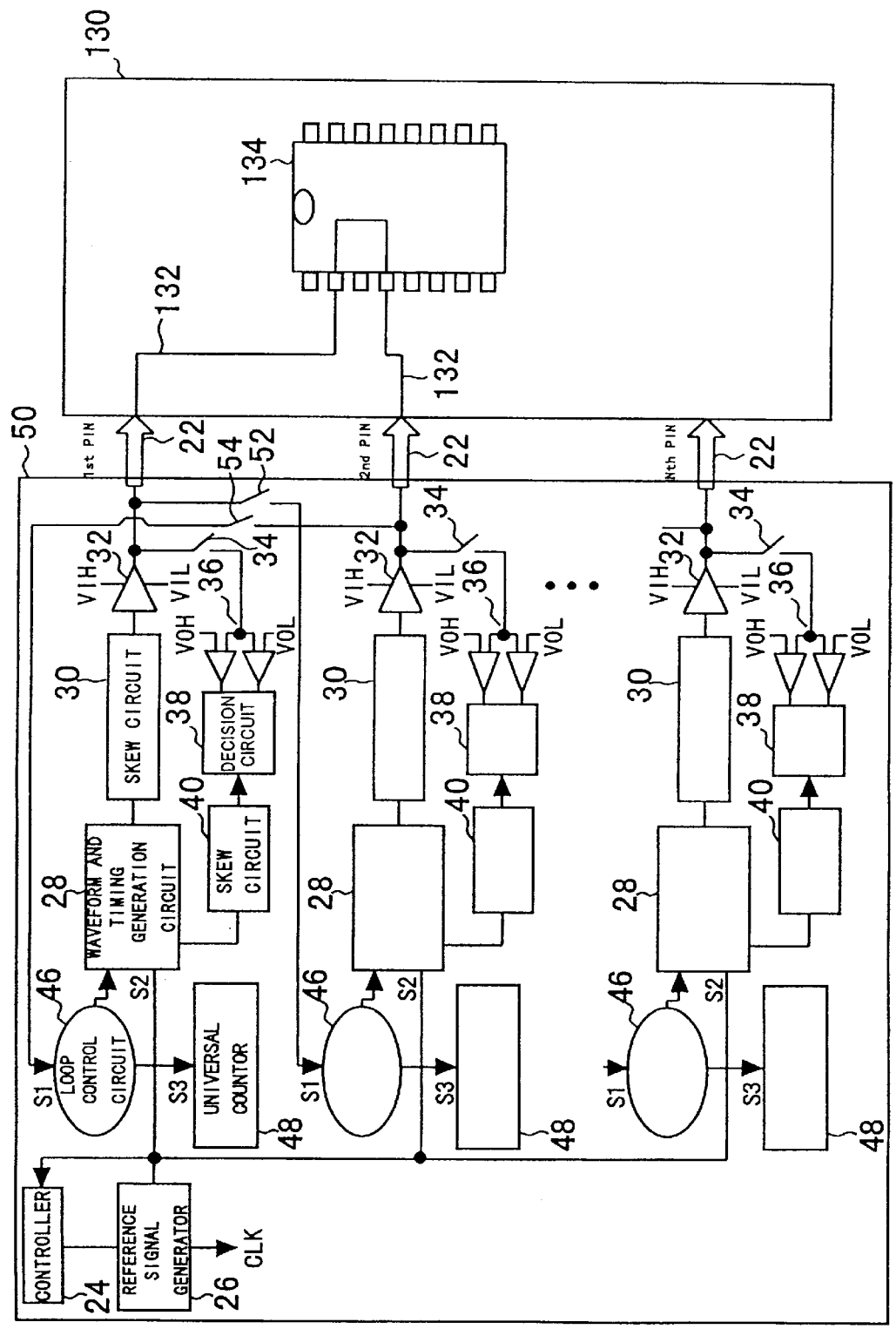
FIG. 9 is a block diagram for describing a timing calibration method performed by an LSI testing apparatus practiced as a third embodiment of the present invention.

A third embodiment of this invention will now be described with reference to FIGS. 9 through 11. FIG. 9 is a block diagram depicting a structure of an LSI testing apparatus 50 practiced as the third embodiment as well as a structure of a performance board 130 used as an attachment to the LSI testing apparatus 50. The LSI testing apparatus 50 as the third embodiment is substantially similar in structure to the second embodiment.

The performance board 130 comprises signal paths 132 corresponding individually to the I/O pins 22 furnished on the LSI testing apparatus 50. The signal paths 132 are connected to the pins of an LSI mounted on the performance board 130. In FIG. 9, the performance board 130 carries a dummy LSI 134, which is another attachment to the LSI testing apparatus 50. Inside the dummy LSI 134 are wires each for short-circuiting a signal path 132 corresponding to an even-numbered terminal of the LSI testing apparatus 50, to a signal path 132 each corresponding to an odd-numbered terminal adjacent to the even-numbered terminal.

Figure 10:
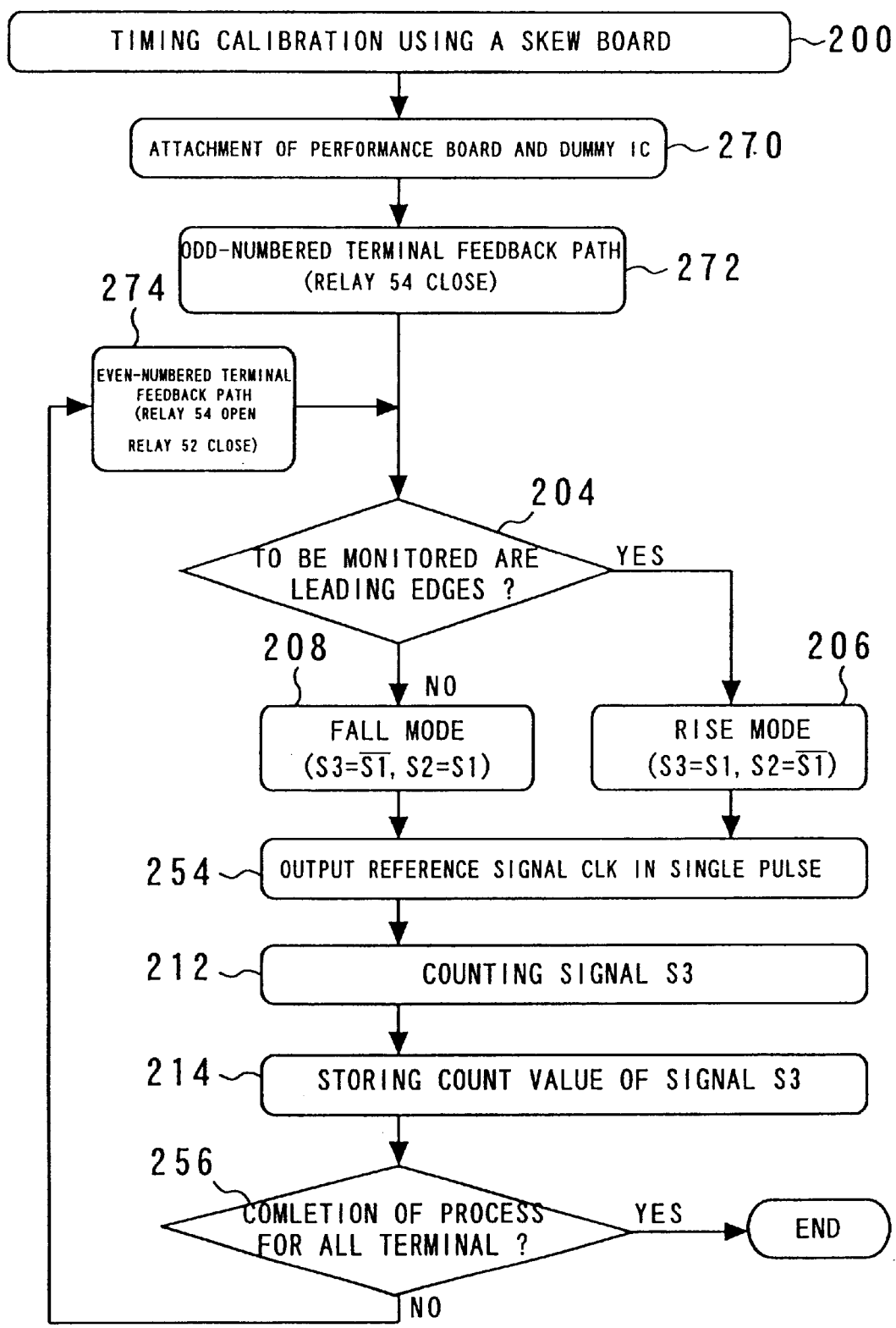
FIG. 10 is a flowchart of steps constituting an initial timing calibration of the LSI testing apparatus shown in FIG. 9.

FIG. 10 is a flowchart of steps constituting the initial timing calibration of the LSI testing apparatus 50. The initial timing calibration of the apparatus is performed illustratively at the time of its shipment from the factory. In FIG. 10, the steps with their functionally identical counterparts already shown in FIG. 7 are given the same reference numerals, and their detailed descriptions are abbreviated or omitted hereunder.

In step 200, the initial timing calibration is carried out using the skew board 100 as in the case of the second embodiment. Immediately after the initial timing calibration has ended, step 270 is reached.

In step 270, the performance board 130 is connected to the LSI testing apparatus 50 as an attachment while the dummy LSI 134, i.e., another attachment to the LSI testing apparatus 50, is mounted on the performance board 130.

In step 272, a relay 54 of the LSI testing apparatus 50 is closed. In the third embodiment, the performance board 130 and dummy LSI 134 short-circuit the odd- and even-numbered terminals on the LSI testing apparatus 50. Closing a relay 54 thus forms a feedback path comprising the corresponding odd-numbered terminal.

In steps 204 through 208, 254, 212 and 214, the count value representing the status of the skew circuit 30 corresponding to the I/O terminal 22 in question (odd-numbered terminal this time) is stored into the controller 24 as the reference data for simplified processing in the same manner as in the second embodiment.

In step 256, a check is made to see if the process above is completed on all odd- and even-numbered terminals. If even-numbered terminal has yet to undergo the process, step 274 is reached; if all terminals are judged to have undergone the process, the current processing is terminated.

In step 274, the relay 54 is opened and a relay 52 is closed. Because the dummy LSI keeps the odd- and even-numbered terminal short-circuited, carrying out step 274 forms a feedback path corresponding to an even-numbered terminal.

Thereafter, step 204 and subsequent steps are carried out in the same manner as when the feedback path is formed for an odd-numbered terminal. The steps, when performed, store into the controller 24 the reference data for simplified processing regarding the even-numbered terminal in question. The process above makes it possible to store the reference data for simplified processing on all I/O terminals 22, i.e., the count values reflecting the delay times Dup and Ddown generated by the skew circuit 30 in such a manner that leading and trailing edges of the output signal are made to comply with the standard timing on all I/O terminals 22.

At a semiconductor factory, the LSI testing apparatus 50 practiced as the third embodiment is usually used with the performance board 130 attached thereto. The LSI testing apparatus 50 is capable of carrying out the simplified calibration while being connected to the performance board 130 by utilizing the above-described reference data for simplified processing without recourse to a skew board 100.

Figure 11:
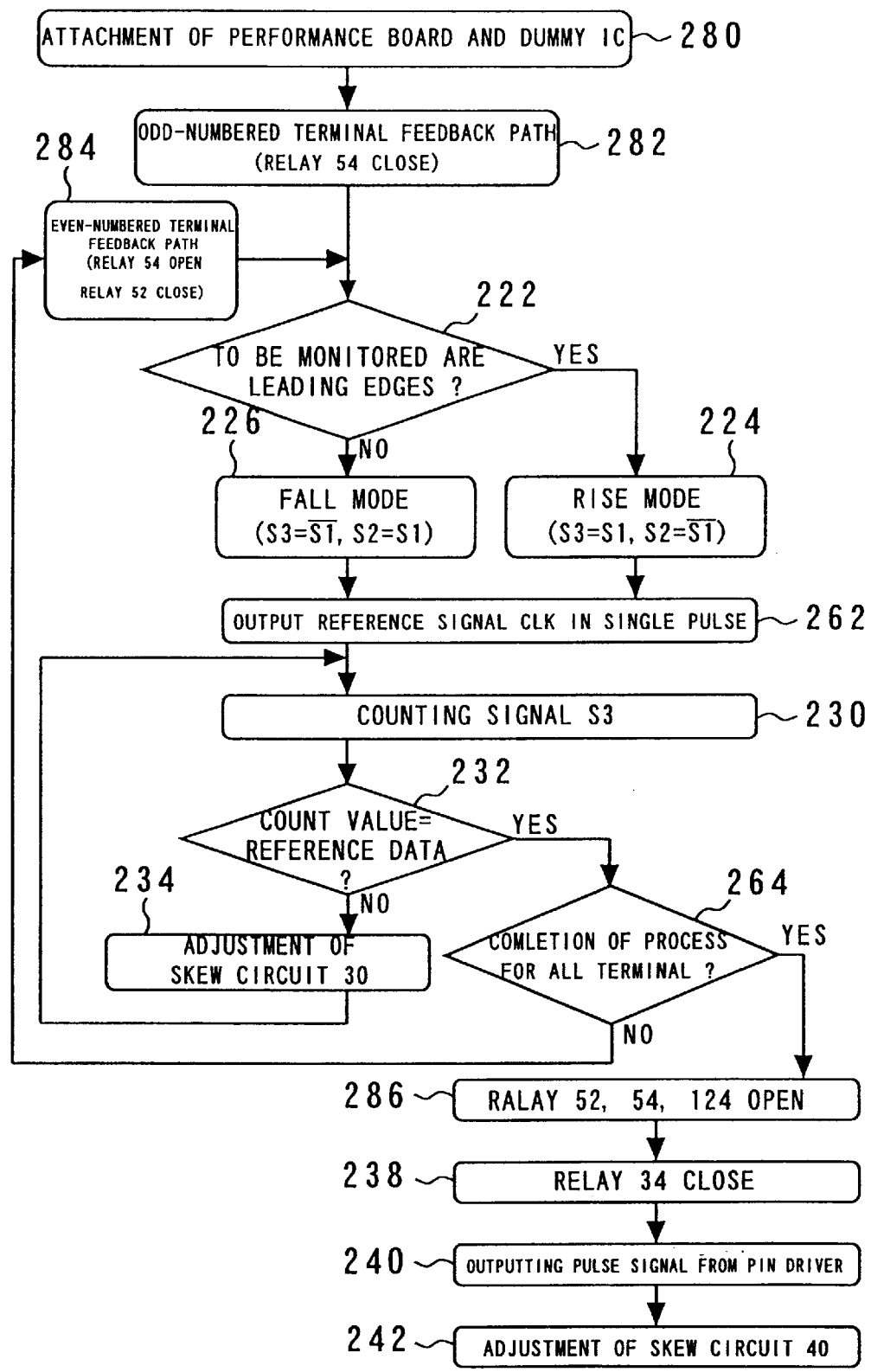
FIG. 11 is a flowchart of steps constituting a simplified timing calibration of the LSI testing apparatus shown in FIG. 9.
Figure 12:
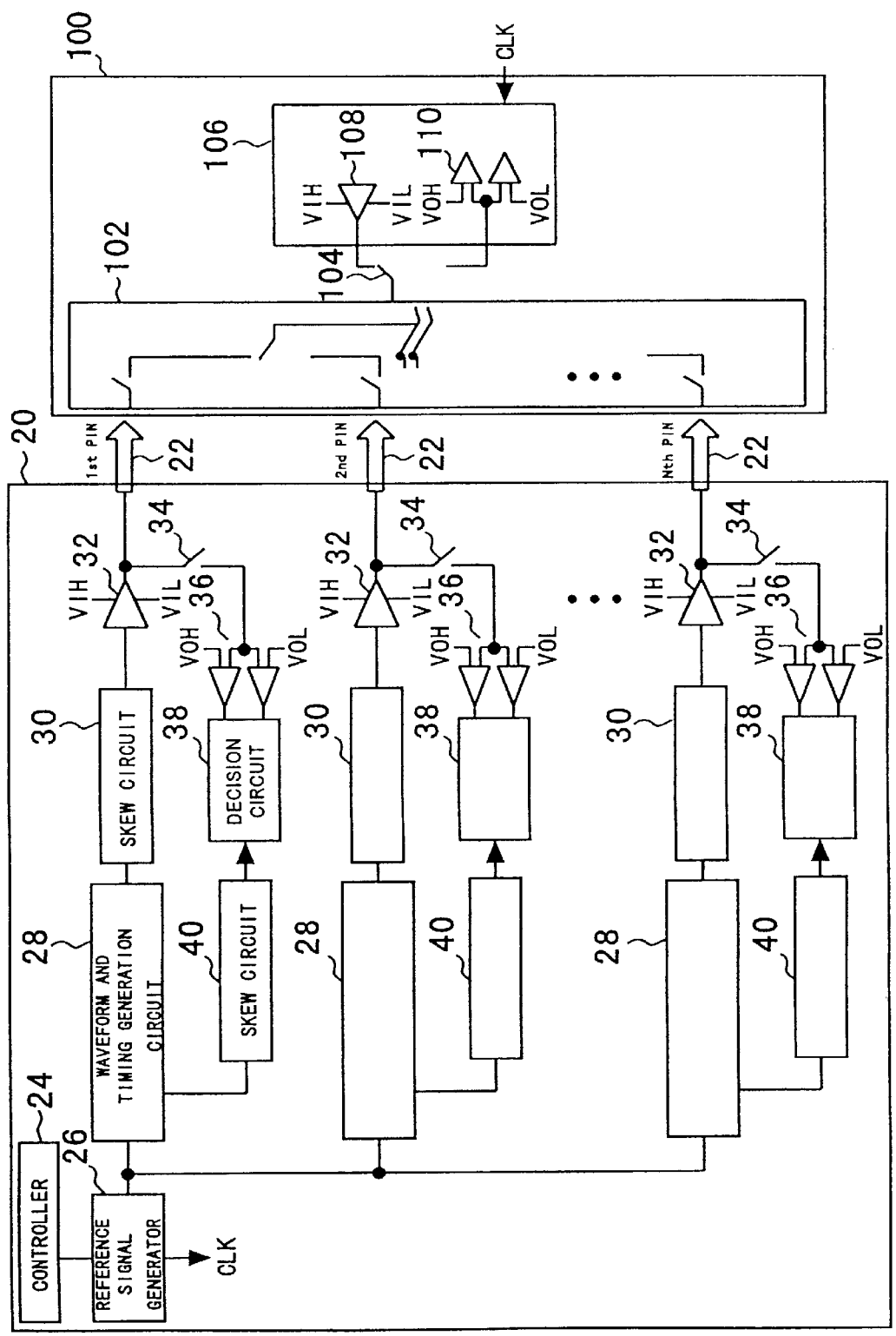
FIG. 12 is a block diagram for describing a timing calibration method performed by a conventional LSI testing apparatus.

FIG. 11 is a flowchart of steps executed to implement the simplified calibration. In FIG. 11, the steps with their functionally identical counterparts already shown in FIG. 8 are given the same reference numerals, and their detailed descriptions are abbreviated or omitted hereunder.

In the simplified calibration, as shown in step 280, the performance board 130 is first attached to the LSI testing apparatus 50. The dummy LSI 134 is then mounted on the performance board 130.

In step 282, a relay 54 of the LSI testing apparatus 50 is closed. Because the dummy LSI 134 keeps the odd- and even-numbered terminal short-circuited, carrying out step 272 forms a feedback path corresponding to an odd-numbered terminal.

In steps 222 through 226, 262, and 230 through 234, the skew circuit 30 corresponding to the I/O terminal 22 in question (odd-numbered terminal this time) is properly adjusted in its status in the same manner as in the second embodiment.

In step 264, a check is made to see if the adjustment of the skew circuit 30 is completed on all odd- and even-numbered terminals. If even-numbered terminal has yet to undergo the adjustment, step 284 is reached; if all terminals are judged to have undergone the adjustment, step 286 is reached.

Instep 284, the relay 54 is opened and a relay 52 is closed. Because the dummy LSI 134 keeps the odd- and even-numbered terminal short-circuited, carrying out step 284 forms a feedback path corresponding to an even-numbered terminal.

Thereafter, step 222 and subsequent steps are carried out in the same manner as when the feedback path is formed for an odd-numbered terminal. The steps above, when performed, properly adjust the status of the skew circuit 30 corresponding to the even-numbered terminal. This synchronizes the timings of the output signal with respect to all I/O terminals 22.

Steps 262 and 230 through 234 of the third embodiment may be carried out concurrently on a plurality of I/O terminals 22. Under the above-described scheme of simplified calibration, the timing calibration of the output signal may be completed in a short period of time regardless of the number of I/O terminals 22 furnished on the LSI testing apparatus 50.

In steps 286 and 238 through 242, as in the case of the first or the second embodiment, the skew circuit 40 is adjusted by use of the output signal which is just properly calibrated. These steps are carried out on the circuits corresponding to all I/O terminals 22. Thus the steps above, when performed, synchronize the determining timings of the input signal with respect to all I/O terminals 22.

Steps 286 and 238 through 242 of the third embodiment may be carried out concurrently on a plurality of I/O terminals 22. Under the above-described scheme of simplified calibration, the determining timing of the input signal may be calibrated in a short period of time regardless of the number of I/O terminals 22 furnished on the LSI testing apparatus 50.

As described, the LSI testing apparatus 50 practiced as the third embodiment may carry out the simplified calibration while being connected with the performance board 130. This allows the inventive LSI testing apparatus 50 to achieve a high yield rate when used at semiconductor factories.

The simplified calibration of the LSI testing apparatus 50 is performed by use of feedback paths comprising the signal paths 132 on the performance board 130. More specifically, the simplified calibration utilizes feedback paths including the entire regions of the signal paths 132 interposed between the I/O terminals 22 on the one hand and the LSI to be tested on the other hand. This means that the simplified calibration of the third embodiment may absorb the effects of characteristic changes over the signal paths 132 at a significantly higher degree of precision than in the case of the second embodiment. In carrying out the simplified calibration, the third embodiment thus provides more accurate timing adjustment than the second embodiment.

Although the third embodiment was shown forming a feedback path of each I/O terminal 22 by use of the signal path 132 corresponding to the adjacent I/O terminal 22, this is not limitative of the invention. Other variations may be made when every I/O terminal 22 meets three conditions described below: the first condition is that a feedback path must be provided to let the output signal S1 of the pin driver 32 be fed back to the loop control circuit 46; the second condition is that the feedback path must be formed using both the signal path 132 for the current I/O terminal 22 and the signal path 132 corresponding to another I/O terminal 22; and the third condition is that the signal path 132 included in the feedback path for the current I/O terminal 22 and the signal path 132 corresponding to another I/O terminal 22 must be short-circuited by a dummy IC.

Each of the first through the third embodiment above was shown detecting the status of the skew circuit 30 immediately after the timing calibration on the basis of the number of pulses counted by the universal counter 48 over a predetermined period of time. However, this is not limitative of the invention. Alternatively, the status of the skew circuit 30 may be detected in accordance with the time required for the number of pulses counted by the universal counter 48 to reach a predetermined count value.

The major benefits of the present invention described above are summarized as follows:

According to the first aspect of the present invention, the output signal from each I/O terminal is fed back through a feedback path. Because the output signal sent over the feedback path reflects delays generated by the skew circuit, the status of the skew circuit which is stored immediately after the circuit adjustment proves to be the proper status of the skew circuit. When the individual control circuits retain the proper status of the respective skew circuits, the process of putting each skew circuit in its proper status, i.e., timing calibration, can be performed concurrently by a plurality of control circuits. Thus the inventive apparatus enables timing calibration to be performed over a reduced period of time without recourse to a skew board.

According to the second aspect of the present invention, after oscillations are generated on the paths including the skew circuits, the number of pulses generated during the oscillations over feedback paths is counted and acquired as a basis for obtaining the reference data for simplified processing. When oscillations are generated on a path including a skew circuit, pulses are generated at intervals reflecting the delay times generated by the skew circuit. Thus the inventive apparatus or method readily provides the reference data for simplified processing accurately representing the status of the skew circuits.

According to the third aspect of the present invention, the reference data for simplified processing may be used to adjust the skew circuits easily to their proper status. The inventive apparatus or method is thus capable of carrying out timing calibration of a plurality of control circuits easily and accurately in a short period of time.

According to the fourth aspect of the present invention, each I/O terminal and another I/O terminal specifically related to that terminal are short-circuited to form a feedback path. This implements an LSI testing apparatus capable of readily forming feedback paths.

According to the fifth aspect of the present invention, the LSI testing apparatus is capable of forming feedback paths for all I/O terminals while a performance board is being attached to the apparatus. This structure ensures highly accurate LSI testing because aged deterioration over the signal paths on the performance board are absorbed by timing calibration.

According to the sixth aspect of the present invention, the LSI testing apparatus is capable of forming feedback paths for all I/O terminals by simply mounting a dummy IC on an attached performance board without switching any wires thereon. This structure also ensures highly accurate LSI testing because aged deterioration over the entire regions of the signal paths on the performance board are absorbed by timing calibration.

According to the seventh aspect of the present invention, immediately after adjustment of a skew circuit, the proper status of the skew circuit is detected on the basis of an output signal sent over the corresponding feedback path. With the proper status of the skew circuits stored corresponding to the individual I/O terminals, timing calibration may be carried out concurrently on a plurality of I/O terminals. The inventive method thus allows timing calibration to be completed in a short period of time without recourse to a skew board.

According to the eighth aspect of the present invention, the feedback paths of all I/O terminals may be readily formed while a performance board is being attached to the LSI testing apparatus. This scheme ensures highly accurate LSI testing because aged deterioration over the signal paths on the performance board are absorbed by timing calibration.

According to the ninth aspect of the present invention, the feedback paths of all I/O terminals may be easily provided by simply mounting a dummy IC on the attached performance board with no wires switched thereon. This scheme also ensures highly accurate LSI testing because aged deterioration in the entire regions of the signal paths on the performance board are absorbed by timing calibration.

Further, the present invention is not limited to these embodiments, but variations and modifications may be made without departing from the scope of the present invention.

The entire disclosure of Japanese Patent Application No. Hei 11-193481 filed on Jul. 7, 1999 including specification, claims, drawings and summary are incorporated herein by reference in its entirety.

What is claimed is:

1. An LSI testing apparatus for carrying out performance tests on an LSI having a plurality of pins, said LSI testing apparatus comprising:

a plurality of I/O terminals provided corresponding to said plurality of pins furnished on said LSI, respectively; and a plurality of control circuits provided corresponding to said plurality of I/O terminals, respectively, wherein each of said plurality of control circuits includes:

a wave form and timing generation circuit for generating an output signal upon receipt of a reference signal;

a skew circuit for adjusting said output signal in timing;

a feedback path for allowing said output signal having passed said skew circuit to be fed back to an input side of said waveform and timing generation circuitry; and a status detection circuit for detecting status of said skew circuit based on the signal sent over said feedback path.

2. The LSI testing apparatus according to claim 1, further comprising:

an oscillation unit for generating oscillation over a path including said wave form and timing generation circuit, said skew circuit and said feedback path; and a storage medium for storing results of the detection by said status detection unit, wherein said status detection unit includes a universal counter for counting the number of pulses appearing on said feedback path as a result of said oscillations, and said storage medium stores reference data for simplified processing based on count values obtained by said universal counter.

3. The LSI testing apparatus according to claim 2, further comprising an adjustment unit for adjusting status of said skew circuit in such a manner that said count values obtained by said universal counter during said oscillations correspond to said reference data for simplified processing stored on said storage medium.

4. An LSI apparatus for carrying out performance tests on an LSI having a plurality of pins, said LSI testing apparatus comprising:

a plurality of I/O terminals corresponding respectively to said plurality of pins furnished on said LSI; and a plurality of control circuits corresponding respectively to said plurality of I/O terminals;

wherein each of said plurality of control circuits includes:

a waveform and timing generation circuit for generating an output signal upon receipt of a reference signal;

a skew circuit for adjusting said output signal in timing;

a first signal feedback path for connecting a specific I/O terminal different from the I/O terminal reached by said output signal having passed said skew circuit, to an input side of said waveform and timing generation circuit; and a status detection unit for storing status of said skew circuit in accordance with a signal sent over said first signal feedback path.

5. The LSI testing apparatus according to claim 4, further comprising a performance board incorporating a plurality of signal paths for connecting said pins of said LSI under test to said plurality of I/O terminals respectively, wherein said performance board connects the signal path of each of said I/O terminals to the signal path of said specific I/O terminal corresponding to the I/O terminal in question in order to form a second signal feedback path.

6. The LSI testing apparatus according to claim 5, further comprising a dummy IC to be mounted on said performance board, wherein the signal path of each of said I/O terminals is connected to the signal path of said specific I/O terminal corresponding to the I/O terminal in question through internal wiring of said dummy IC.

7. The LSI testing apparatus according to claim 4, further comprising:

an oscillation unit for generating oscillations over a path including said waveform and timing generation circuit, said skew circuit and said first signal feedback path; and a storage medium for storing results of the detection by said status detection unit, wherein said status detection unit includes a universal counter for counting the number of pulses appearing on said first signal feedback path as a result of said oscillations, and said storage medium stores reference data for simplified processing based on count values obtained by said universal counter.

8. The LSI testing apparatus according to claim 7, further comprising an adjustment unit for adjusting status of said skew circuit in such a manner that said count values obtained by said universal counter during said oscillations correspond to said reference data for simplified processing stored on said storage medium.

9. A timing calibration method for use with an LSI testing apparatus for carrying out performance tests on an LSI having a plurality of pins, said timing calibration method comprising the steps of:

adjusting a skew circuit furnished corresponding to each of a plurality of I/O terminals attached to said LSI testing apparatus, in such a manner that output signals from said I/O terminals are synchronized in timing;

forming a feedback path for feeding the output signal from each of said I/O terminals, after the adjustment of said skew circuit, to an input side of a waveform and timing generation circuit that has generated the output signal in question; and detecting status of said skew circuit based on the signal sent over said feedback path.

10. The timing calibration method for use with an LSI testing apparatus according to claim 9, further comprising the steps of:

generating oscillations over a path including said waveform and timing generation circuit, said skew circuit and said feedback path;

counting the number of pulses appearing on said feedback path as a result of said oscillations; and storing reference data for simplified processing based on pulse count values obtained in said counting step.

11. The timing calibration method for use with an LSI testing apparatus according to claim 10, further comprising the steps of:

again forming said feedback path when said reference data for simplified processing are stored already;

again generating oscillations over said path including said waveform and timing generation circuit, said skew circuit and said feedback path, after said feedback path has been formed again; and readjusting said status of said skew circuit in such a manner that the number of pulses counted during said oscillations corresponds to said reference data for simplified processing.

12. The timing calibration method for use with an LSI testing apparatus according to claim 9, wherein said feedback path forming step includes the steps of:

connecting an input side of said waveform and timing generation circuit furnished corresponding to any one I/O terminal, to a specific I/O terminal different from said any one I/O terminal; and connecting said any one I/O terminal to said specific I/O terminal on the side of a performance board.

13. The timing calibration method for use with an LSI testing apparatus according to claim 12, wherein said feedback path forming step includes the step of mounting a dummy IC on said performance board, and said dummy IC comprises internal wiring for short-circuiting a signal path furnished on said performance board connected to said any one I/O terminal, to a signal path furnished on said performance board and connected to said specific I/O terminal.

* * * * *